US012755777B2

(12) United States Patent
Nguyen

(10) Patent No.: US 12,755,777 B2
(45) Date of Patent: Oct. 6, 2026

(54) CMOS MEMORY CELL FOR HIGH VOLTAGE APPLICATIONS

(71) Applicant: Microsemi SoC Corp., Chandler, AZ (US)

(72) Inventor: Victor Nguyen, San Ramon, CA (US)

(73) Assignee: Microsemi SoC Corp., Chandler, AZ (US)

(*) Notice: Subject to any disclaimer, the term of this patent is extended or adjusted under 35 U.S.C. 154(b) by 73 days.

(21) Appl. No.: 18/745,559

(22) Filed: Jun. 17, 2024

(65) Prior Publication Data

US 2025/0308579 A1 Oct. 2, 2025

Related U.S. Application Data

(60) Provisional application No. 63/572,578, filed on Apr. 1, 2024.

(51) Int. Cl.
*G11C 11/412* (2006.01)

(52) U.S. Cl.
CPC .................................. *G11C 11/412* (2013.01)

(58) Field of Classification Search
CPC ........................................................ G11C 7/18
See application file for complete search history.

(56) References Cited

U.S. PATENT DOCUMENTS 5,706,226 A * 1/1998 Chan ...................... H10B 10/12 257/E27.099
6,448,822 B1 9/2002 Dadashev
6,627,960 B2 * 9/2003 Nii ......................... H10B 10/12 257/E27.099
9,620,185 B1 * 4/2017 Jeong ...................... G11C 16/12
2006/0062061 A1 * 3/2006 Suh .......................... G11C 7/12 365/189.11
2014/0036581 A1 * 2/2014 Agarwal .................. G11C 7/12 365/156
2018/0166125 A1 6/2018 Wang et al.
2022/0130460 A1 * 4/2022 Yang ...................... G11C 16/30

OTHER PUBLICATIONS

International Search Report and Written Opinion for PCT Application No. PCT/US2024/034351 (Dated Dec. 11, 2024).

* cited by examiner

*Primary Examiner* — Amir Zarabian
*Assistant Examiner* — Anthony Thinh Tang
(74) *Attorney, Agent, or Firm* — Hovey Williams LLP

(57) ABSTRACT

A memory cell comprises a plurality of n-type metal oxide semiconductor (NMOS) transistors and a plurality of p-type metal oxide semiconductor (PMOS) transistors. First and second NMOS transistors are electrically connected to one another in a cross-coupled configuration. First and second PMOS transistors are electrically connected to one another in a cross-coupled configuration. Third and fourth NMOS transistors are electrically connected to the first and second NMOS transistors in a cascode configuration. Third and fourth PMOS transistors are electrically connected to the first and second PMOS transistors in a cascode configuration. A fifth PMOS transistor includes a drain, a gate, and a source, wherein the drain is electrically connected to a gate of the second PMOS transistor and a drain of the first PMOS transistor, and the source is electrically connected to a gate of the first PMOS transistor and a drain of the second PMOS transistor.

20 Claims, 2 Drawing Sheets

100

| STATE | BL | BLB | WL | WLN | WLP | PBIAS | OUT |
|---|---|---|---|---|---|---|---|
| Idle 0 | Float | Float | 0V | 0.5V | 1.2V | 0.7V | 0V |
| Idle 1 | Float | Float | 0V | 0.5V | 1.2V | 0.7V | 1.2V |
| Write 0 Phase 1 | 0V | VDD | 0V | 0V | 1.2V | 0.5V | 1.2V |
| Write 0 Phase 2 | 0V | VDD | 0.7V | 0V | 0.5V | 0.5V | 1.2V |
| Write 0 Phase 3 | 0V | VDD | 0.7V | 0.5V | 1.2V | 0.5V | 0V |
| Write 1 Phase 1 | VDD | 0V | 0V | 0V | 1.2V | 0.5V | 0V |
| Write 1 Phase 2 | VDD | 0V | 0.7V | 0V | 0.5V | 0.5V | 0V |
| Write 1 Phase 3 | VDD | 0V | 0.7V | 0.5V | 1.2V | 0.5V | 1.2V |
| Read 0 Phase 1 | Float | Float | 0.7V | 0.7V | 1.2V | 0.7V | 0V |
| Read 0 Phase 2 | 0V | 0.7 V - NMOS VT | 0.7V | 0.7V | 1.2V | 0.7V | 0V |
| Read 1 Phase 1 | Float | Float | 0.7V | 0.7V | 1.2V | 0.7V | 1.2V |
| Read 1 Phase 2 | 0.7 V - NMOS VT | 0V | 0.7V | 0.7V | 1.2V | 0.7V | 1.2V |

Fig. 2.

CMOS MEMORY CELL FOR HIGH VOLTAGE APPLICATIONS

CROSS-REFERENCE TO RELATED APPLICATIONS

The current patent application is a non-provisional utility patent application which claims priority benefit, with regard to all common subject matter, of earlier-filed U.S. Provisional Application Ser. No. 63/572,578; titled "CMOS MEMORY CELL FOR HIGH VOLTAGE APPLICATIONS"; and filed Apr. 1, 2024. The Provisional Application is hereby incorporated by reference, in its entirety, into the current patent application.

FIELD OF THE INVENTION

Various examples of the present disclosure relate to binary data storage memory cells utilizing complementary metal oxide semiconductor (CMOS) technology.

BACKGROUND OF THE INVENTION

A memory cell for single bit data storage that is formed from complementary metal oxide semiconductor (CMOS) technology often includes first and second cross-coupled n-type MOS (NMOS) transistors and first and second cross-coupled p-type MOS (PMOS) transistors. The NMOS transistors are electrically connected to ground, and one of the NMOS transistors turns on when an output of the memory cell has a value of logic zero. The PMOS transistors are electrically connected to a voltage supply, known as VDD, and one of the PMOS transistors turns on when the output of the memory cell has a value of logic one. The memory cell also typically includes first and second access transistors to provide data to be stored in the memory cell. In order to force the memory cell to change its state (that is, from previously storing a logic zero to now storing a logic one, or vice versa), the first and second access transistors have to be sized appropriately compared to the sizes of the NMOS and PMOS transistors. The issue becomes more important when a voltage supply with a voltage level that is greater than VDD ("high voltage") is electrically connected to the PMOS transistors. In such a situation, it is more difficult to change the state of the PMOS transistors, which leads to write failures (that is, data not storing properly) or to increased sizing of certain transistors to provide greater ability to change the state of the PMOS transistors. Increased sizing of any transistors has the additional downside of reducing the density of data storage, meaning that fewer bits of data can be stored in the same space, and potentially leading to increased power consumption.

The background discussion is intended to provide information related to the present disclosure which is not necessarily prior art.

SUMMARY OF THE INVENTION

Various examples address one or more of the above-mentioned problems and provide a memory cell with improved performance when being supplied with a voltage that is greater than VDD, which is considered "high voltage". The memory cell includes an additional PMOS transistor that is electrically connected to the first and second cross-coupled PMOS transistors. When the additional PMOS transistor is turned on, it effectively resets the first and second cross-coupled PMOS transistors so that data can more easily be written to the memory cell.

Various examples of the memory cell broadly comprise first and second n-type metal oxide semiconductor (NMOS) transistors, first and second p-type metal oxide semiconductor (PMOS) transistors, third and fourth NMOS transistors, third and fourth PMOS transistors, and a fifth PMOS transistor. The first and second NMOS transistors are electrically connected to one another in a cross-coupled configuration. The first and second PMOS transistors are electrically connected to one another in a cross-coupled configuration. The third and fourth NMOS transistors each include a gate, wherein the gate of the third NMOS transistor is electrically connected to the gate of the fourth NMOS transistor. The third NMOS transistor is electrically connected in a cascode configuration to a drain of the first NMOS transistor, and the fourth NMOS transistor is electrically connected in a cascode configuration to a drain of the second NMOS transistor. The third and fourth PMOS transistors each include a gate, wherein the gate of the third PMOS transistor is electrically connected to the gate of the fourth PMOS transistor. The third PMOS transistor is electrically connected in a cascode configuration to a drain of the first PMOS transistor, and the fourth PMOS transistor is electrically connected in a cascode configuration to a drain of the second PMOS transistor. The fifth PMOS transistor includes a drain, a gate, and a source, wherein the drain is electrically connected to a gate of the second PMOS transistor and the drain of the first PMOS transistor. The source of the fifth PMOS transistor is electrically connected to a gate of the first PMOS transistor and the drain of the second PMOS transistor.

Various examples of the memory cell may also broadly comprise first and second NMOS transistors, first and second PMOS transistors, third and fourth NMOS transistors, third and fourth PMOS transistors, a fifth PMOS transistor, and fifth and sixth NMOS transistors. The first and second NMOS transistors are electrically connected to one another in a cross-coupled configuration. The first and second NMOS transistors respectively include a source that is electrically connected to an electrical common point. The first and second PMOS transistors are electrically connected to one another in a cross-coupled configuration. The first and second PMOS transistors respectively include a drain that is electrically connected to a voltage supply having a voltage ranging from approximately 1.2 times to approximately 2 times a safe operating limit for voltage, that is, approximately 0.84 Volts to approximately 1.4 Volts. The third and fourth NMOS transistors each include a gate, wherein the gate of the third NMOS transistor is electrically connected to the gate of the fourth NMOS transistor. The third NMOS transistor is electrically connected in a cascode configuration to a drain of the first NMOS transistor, and the fourth NMOS transistor is electrically connected in a cascode configuration to a drain of the second NMOS transistor. The third and fourth PMOS transistors each include a gate, wherein the gate of the third PMOS transistor is electrically connected to the gate of the fourth PMOS transistor. The third PMOS transistor is electrically connected in a cascode configuration to a drain of the first PMOS transistor, and the fourth PMOS transistor is electrically connected in a cascode configuration to a drain of the second PMOS transistor. The fifth PMOS transistor includes a drain, a gate, and a source, wherein the drain is electrically connected to a gate of the second PMOS transistor and the drain of the first PMOS transistor. The source of the fifth PMOS transistor is electrically connected to a gate of the first PMOS transistor and the drain of the second PMOS transistor. The fifth and sixth NMOS transistors respectively include a drain, a gate, and a source. The source of the fifth NMOS transistor is electrically connected to the first and the third NMOS transistors. The source of the sixth NMOS transistor is electrically connected to the second and the fourth NMOS transistors. The drain of the fifth NMOS transistor is electrically connected to a bit line bar electronic signal. The drain of the sixth NMOS transistor is electrically connected to a bit line electronic signal. The gates of the fifth and sixth NMOS transistors are electrically connected to a first word line electronic signal.

This summary is provided to introduce a selection of concepts in a simplified form that are further described below in the detailed description. This summary is not intended to identify key features or essential features of the claimed subject matter, nor is it intended to be used to limit the scope of the claimed subject matter. Other aspects and advantages of the current disclosure will be apparent from the following detailed description of the examples and the accompanying drawing figures.

BRIEF DESCRIPTION OF DRAWINGS

Various examples of the present disclosure are described in detail below with reference to the attached drawing figures, wherein:

FIG. 2 is a table listing a plurality of voltage settings for various nodes of the memory cell of FIG. 1, the voltages to be applied to the nodes during idle states, a read data process, and a write data process.

Figure 1:
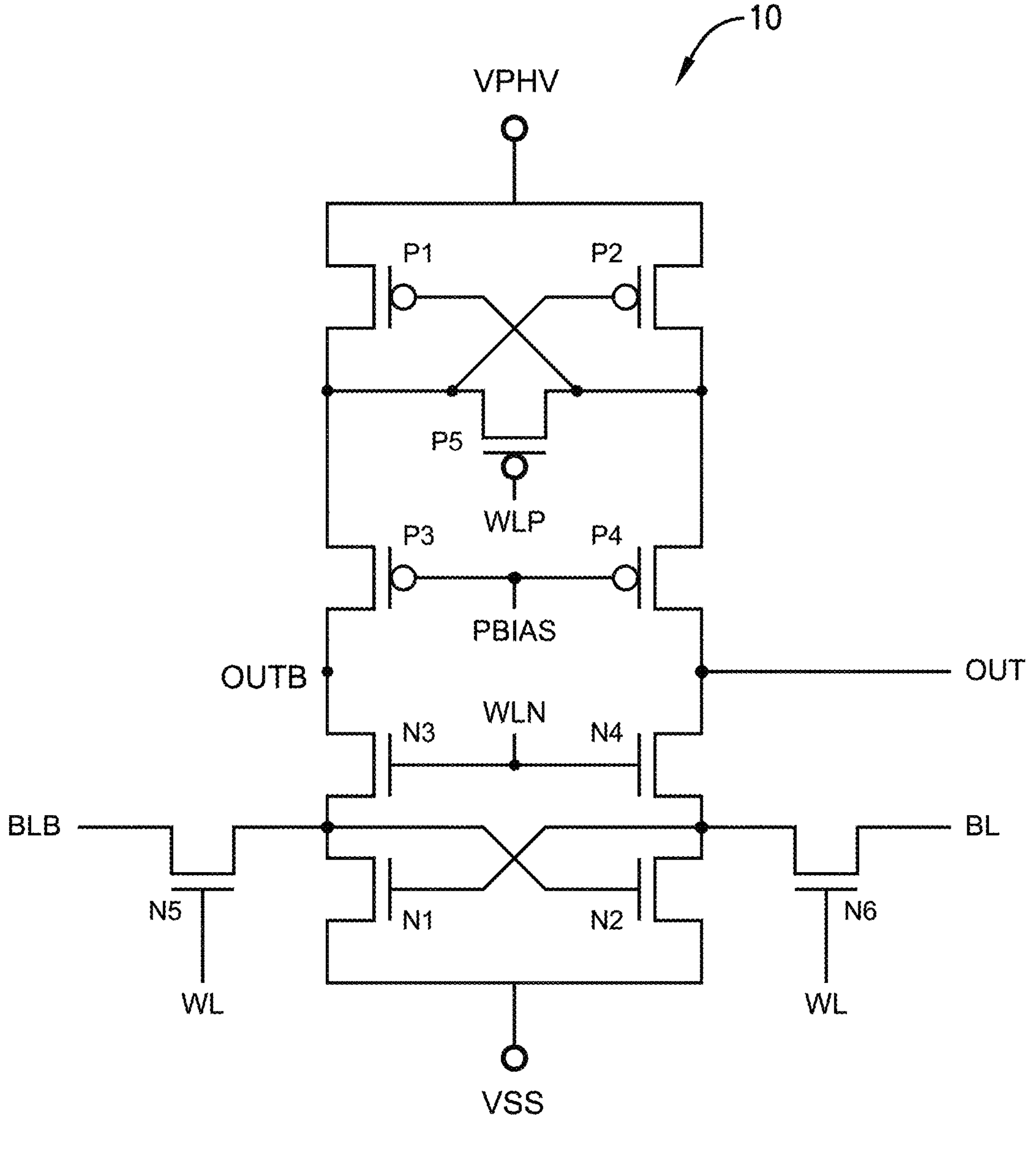
FIG. 1 is an electrical schematic of a memory cell constructed in accordance with various examples of the present disclosure, the schematic depicting the electrical connections of a plurality of metal oxide semiconductor field effect transistors (MOSFETs) that form the memory cell.

The drawing figures do not limit the current disclosure to the specific examples disclosed and described herein. The drawings are not necessarily to scale, emphasis instead being placed upon clearly illustrating the principles of the disclosure.

DETAILED DESCRIPTION OF THE INVENTION

The following detailed description of the technology references the accompanying drawings that illustrate specific examples in which the technology can be practiced. The examples are intended to describe aspects of the technology in sufficient detail to enable those skilled in the art to practice the technology. Other examples can be utilized and changes can be made without departing from the scope of the current disclosure. The following detailed description is, therefore, not to be taken in a limiting sense. The scope of the current disclosure is defined only by the appended claims, along with the full scope of equivalents to which such claims are entitled.

In the following description, the word "voltage" may be used to describe electric voltage, the word "current" may be used to describe electric current, and the word "power" may be used to describe electric power.

A memory cell 10, constructed in accordance with various examples, is shown in FIG. 1. The memory cell 10 provides single bit binary data storage (storing a zero "0" or a one "1") utilizing a static random access memory (SRAM) configuration fabricated from standard process complementary metal oxide semiconductor (CMOS) technology. The memory cell 10 broadly comprises eleven metal oxide semiconductor field effect transistors (MOSFETs) with transistors N1-N6 being n-type MOSFETs (NMOS) and transistors P1-P5 being p-type MOSFETs (PMOS). Each transistor N1-N6 and P1-P5 includes a respective drain node ("drain"), a respective gate node ("gate"), and a respective source node ("source") according to MOSFET technology. Data is read from, and written to, the memory cell 10 utilizing bit line and word line electronic signals according to memory cell technology.

The gate of the first NMOS transistor N1 is electrically connected to the drain of the second NMOS transistor N2, and the gate of the second NMOS transistor N2 is electrically connected to the drain of the first NMOS transistor N1 to form a cross-coupled configuration. The source of the first NMOS transistor N1 is electrically connected to the source of the second NMOS transistor N2. Furthermore, the source of the first NMOS transistor N1 and the source of the second NMOS transistor N2 are each electrically connected to a common node labeled "VSS", wherein VSS is electrically connected to a bulk node (according to MOSFET technology) of all of the NMOS transistors N1-N6 and may be electrically connected to electric ground (GND).

The gate of the first PMOS transistor P1 is electrically connected to the drain of the second PMOS transistor P2, and the gate of the second PMOS transistor P2 is electrically connected to the drain of the first PMOS transistor P1 to form a cross-coupled configuration. The source of the first PMOS transistor P1 is electrically connected to the source of the second PMOS transistor P2. Furthermore, the source of the first PMOS transistor P1 and the source of the second PMOS transistor P2 are each electrically connected to a common node labeled "VPHV", wherein VPHV is electrically connected to a voltage source or supply.

In a traditional memory cell, the source of the first PMOS transistor P1 and the source of the second PMOS transistor P2 are each electrically connected to a voltage source or supply typically known as "VDD", which may have a voltage value of 0.7 V. According to examples of the present disclosure, however, VPHV may have a voltage value of approximately 1.2 times to approximately 2 times the voltage value of VDD, which may result in a supply voltage ranging from approximately 0.84 V to approximately 1.4 V. Having a voltage supply with a voltage value of 0.7 V provides safe operation for the NMOS transistors and the PMOS transistors in the memory cell 10.

The gate of the third NMOS transistor N3 is electrically connected to the gate of the fourth NMOS transistor N4. The gates of the third NMOS transistor N3 and the fourth NMOS transistor N4 are each also electrically connected to a bias electronic source or signal labeled "WLN", which may be provided on a first word line. The bias signal WLN is utilized to control the operation of the transistors and may have a voltage ranging from approximately zero Volts to approximately 0.7 V. The source of the third NMOS transistor N3 is electrically connected to the drain of the first NMOS transistor N1 so that the third NMOS transistor N3 and the first NMOS transistor N1 are connected in a cascode configuration, and the source of the fourth NMOS transistor N4 is electrically connected to the drain of the second NMOS transistor N2 so that the fourth NMOS transistor N4 and the second NMOS transistor N2 are connected in a cascode configuration. The gates of the third NMOS transistor N3 and the fourth NMOS transistor N4 respectively may both be biased, by applying a voltage of approximately 0.5 V to the gates of the third NMOS transistor N3 and the fourth NMOS transistor N4 respectively, to provide lower power consumption for the memory cell 10 during idle states. Otherwise, during read or write states, the gates of the third NMOS transistor N3 and the fourth NMOS transistor N4 respectively are biased, by applying a voltage of approximately 0 V or approximately 0.7 V to the gates of the third NMOS transistor N3 and the fourth NMOS transistor N4 respectively, to provide appropriate read and write operation at a cost of higher power consumption.

The gate of the third PMOS transistor P3 is electrically connected to the gate of the fourth PMOS transistor P4. The gates of the third PMOS transistor P3 and the fourth PMOS transistor P4 are each also electrically connected to a bias electronic source or signal labeled "PBIAS", which is utilized to control the operation of the transistors and may have a voltage ranging from approximately 0.5 V to approximately 0.7 V (roughly half of the supply voltage VPHV plus and minus approximately 0.2 V). The source of the third PMOS transistor P3 is electrically connected to the drain of the first PMOS transistor P1 so that the third PMOS transistor P3 and the first PMOS transistor P1 are connected in a cascode configuration, and the source of the fourth PMOS transistor P4 is electrically connected to the drain of the second PMOS transistor P2 so that the fourth PMOS transistor P4 and the second PMOS transistor P2 are connected in a cascode configuration. In addition, the drain of the third PMOS transistor P3 is electrically connected to the drain of the third NMOS transistor N3, and the drain of the fourth PMOS transistor P4 is electrically connected to the drain of the fourth NMOS transistor N4. The gates of the third PMOS transistor P3 and the fourth PMOS transistor P4 respectively may both be biased, by applying a voltage of approximately 0.7 V to the gates of the third PMOS transistor P3 and the fourth PMOS transistor P4 respectively, to provide lower power consumption for the memory cell 10 during idle states. Otherwise, during a read data operation and a write data operation, the gates of the third PMOS transistor P3 and the fourth PMOS transistor P4 respectively are biased, by applying a voltage of approximately 0.5 V to the gates of the third PMOS transistor P3 and the fourth PMOS transistor P4 respectively, to provide appropriate read and write operation at a cost of higher power consumption. Furthermore, the third PMOS transistor P3 and the fourth PMOS transistor P4 may provide protection from over-voltage stress for the first PMOS transistor P1 and the second PMOS transistor P2.

The node at the connection between the drain of the fourth PMOS transistor P4 and the drain of the fourth NMOS transistor N4 is labeled "OUT" and is an output of the memory cell 10. The node at the connection between the third PMOS transistor P3 and the third NMOS transistor N3 is labeled "OUTB" and is an inverted value of the output of the memory cell 10. Given that the voltage supply for the memory cell 10 (VPHV) may have a voltage value of approximately 1.2 times to approximately 2 times the voltage value of VDD (which is considered "high voltage"), the output OUT of the memory cell is capable of driving higher than normal loads, or to provide an input to circuits for a higher than normal voltage.

The drain of the fifth PMOS transistor P5 is electrically connected to the gate of the second PMOS transistor P2, to the drain of the first PMOS transistor P1, and to the source of the third PMOS transistor P3. The source of the fifth PMOS transistor P5 is electrically connected to the gate of the first PMOS transistor P1, to the drain of the second PMOS transistor P2, and to the source of the fourth PMOS transistor P4. The gate of the fifth PMOS transistor P5 is electrically connected to an electronic source or signal labeled "WLP", which may be provided on a second word line. The bias signal WLP is utilized to control the operation of the transistor and may have a voltage ranging from approximately 0.5 V to approximately 1.2 V (the value of VPHV). The fifth PMOS transistor P5 is utilized during the data storage process. Given that the drain of the fifth PMOS transistor P5 is electrically connected to the gate of the second PMOS transistor P2 and the source is electrically connected to the gate of the first PMOS transistor P1, whenever the fifth PMOS transistor P5 is turned fully on, the gates of the first and second PMOS transistors P1, P2 are nearly electrically shorted to one another and held at roughly the same voltage—putting the first and second PMOS transistors P1, P2 (which are normally in opposing states) into the same state (a metastable state) which makes it easier to subsequently turn the first and second PMOS transistors P1, P2 on or off, respectively, to store data. Once the fifth PMOS transistor P5 is turned off, the gates of the first and second PMOS transistors P1, P2 are no longer shorted together which allows the gates to be driven to a voltage determined by the bit line and bit line bar values, respectively, as will be described further below, so that the new bit value is more easily stored.

The source of the fifth NMOS transistor N5 is electrically connected to the drain of the first NMOS transistor N1 and to the source of the third NMOS transistor N3. The drain of the fifth NMOS transistor N5 is electrically connected to an inverted value of the bit line electronic signal labeled "BLB" (bit line bar). The gate of the fifth NMOS transistor N5 is electrically connected to a word line electronic signal labeled "WL", which may be provided by a third word line. The source of the sixth NMOS transistor N6 is electrically connected to the drain of the second NMOS transistor N2 and to the source of the fourth NMOS transistor N4. The drain of the sixth NMOS transistor N6 is electrically connected to the bit line electronic signal labeled "BL". The gate of the sixth NMOS transistor N6 is electrically connected to the word line electronic signal labeled "WL".

Referring to FIG. 2, a table 100 listing settings of voltage levels for various nodes of the memory cell 10 during various states including idle conditions, the read data operation, and the write data operation is shown. The values shown are merely examples and could vary, or be tuned or adjusted—before or during operation of the memory cell 10, or both—to provide a change in power consumption or other operating parameters.

During idle conditions, whether a zero is being stored or a one is being stored, the word line WL, provided on the third word line, is held at zero Volts (0 V) so that the fifth NMOS transistor N5 and the sixth NMOS transistor N6 are off, and no data is read from, or written to, the memory cell 10. The bit line BL and bit line bar BLB are allowed to float, i.e., not driven to any voltage level. The bias signal WLN, provided on the first word line, is held at 0.5 V so that the third NMOS transistor N3 and the fourth NMOS transistor N4 are partially on. The bias signal PBIAS is held at 0.7 V so that the third PMOS transistor P3 and the fourth PMOS transistor P4 are partially on. The bias signal WLP, provided on the second word line, is held at 1.2 V (the value of VPHV) so that the fifth PMOS transistor P5 is off. The output OUT maintains its voltage level and data value. That is, for a zero, the output OUT follows VSS at zero Volts, and for a one, the output OUT follows VPHV at 1.2 V.

During the read data operation, the word line electronic signal WL, provided on the third word line, has a voltage of 0.7 V so that the fifth NMOS transistor N5 and the sixth NMOS transistor N6 are on. The bias signal WLN, provided on the first word line, has a voltage of 0.7 V so that the third NMOS transistor N3 and the fourth NMOS transistor N4 are partially on. The bias signal PBIAS has a voltage of 0.7 V so that the third PMOS transistor P3 and the fourth PMOS transistor P4 are partially on. The bias signal WLP, provided on the second word line, has a voltage of 1.2 V so that the fifth PMOS transistor P5 is off. When the memory cell 10 has stored a zero the output OUT follows VSS, e.g., at zero Volts, and when the memory cell 10 has stored a one, the output OUT follows VPHV at 1.2 V. The bit line BL and bit line bar BLB are allowed to float during a first phase. During a second phase, the bit line BL and bit line bar BLB settle to a voltage level according to the data being read. When the memory cell 10 has stored a zero, during the second read phase, the bit line BL settles at zero Volts, and the bit line bar BLB settles at a voltage of VDD. When the memory cell 10 has stored a one, during the second read phase, the bit line BL settles at a voltage of VDD, and the bit line bar BLB settles at zero Volts.

The table 100 lists separate settings for writing a zero (0) and for writing a one (1) to the memory cell 10, wherein the writing process includes a plurality of phases during which the voltages at some of the nodes are changed in sequence. When writing a zero, the bit line BL is driven to zero Volts, and the bit line bar BLB is driven to VDD. During a first phase, the word line electronic signal WL, provided on the third word line, has a voltage of zero Volts so that the fifth NMOS transistor N5 and the sixth NMOS transistor N6 are off, preventing data from the bit lines to be written. The bias signal WLN, provided on the first word line, has a voltage of zero Volts so that the third NMOS transistor N3 and the fourth NMOS transistor N4 are off. The bias signal PBIAS has a voltage of 0.5 V so that the third PMOS transistor P3 and the fourth PMOS transistor P4 are on. The bias signal WLP, provided on the second word line, has a voltage of 1.2 V so that the fifth PMOS transistor P5 is off.

During a second write phase, the word line electronic signal WL, provided on the third word line, has a voltage of 0.7 V so that the fifth NMOS transistor N5 and the sixth NMOS transistor N6 are on, allowing data from the bit lines BL, BLB to be written at least to the first NMOS transistor N1 and the second NMOS transistor N2. Accordingly, the gate of the first NMOS transistor N1 receives zero Volts from BL and is turned off. The gate of the second NMOS transistor N2 receives VDD from BLB and is turned on. The bias signal WLN, provided on the first word line, has a voltage of zero Volts so that the third NMOS transistor N3 and the fourth NMOS transistor N4 are off. The bias signal PBIAS has a voltage of 0.5 V so that the third PMOS transistor P3 and the fourth PMOS transistor P4 are partially on. The bias signal WLP, provided on the second word line, has a voltage of 0.5 V so that the fifth PMOS transistor P5 is partially on. As discussed above, turning partially on the fifth PMOS transistor P5 with a voltage of 0.5 V drives the first PMOS transistor P1 and the second PMOS transistor P2 into a metastable state, making it easier for the transistors P1, P2 to subsequently be turned on or off to store data.

During a third write phase, the word line electronic signal WL, provided on the third word line, still has a voltage of 0.7 V so that the fifth NMOS transistor N5 and the sixth NMOS transistor N6 are still on. The bias signal WLN, provided on the first word line, has a voltage of 0.5 V so that the third NMOS transistor N3 and the fourth NMOS transistor N4 are partially on. The bias signal PBIAS has a voltage of 0.5 V so that the third PMOS transistor P3 and the fourth PMOS transistor P4 are partially on. The bias signal WLP, provided on the second word line, has a voltage of 1.2 V so that the fifth PMOS transistor P5 is off. With the third NMOS transistor N3, the fourth NMOS transistor N4, the third PMOS transistor P3, and the fourth PMOS transistor P4 all being partially on and the fifth PMOS transistor P5 being off, the voltages from the bit lines BL, BLB (after some voltage drops) propagate to the first PMOS transistor P1 and the second PMOS transistor P2. That is, the gate of the first PMOS transistor P1 receives the bit line BL voltage of zero Volts, which turns the first PMOS transistor P1 on. The gate of the second PMOS transistor P2 receives the bit line bar BLB voltage of VDD, which turns the second PMOS transistor P2 off. With the second NMOS transistor N2 being on and the fourth NMOS transistor N4 (along with the sixth NMOS transistor N6) being partially on, the output OUT has a voltage of approximately VSS—zero Volts, logic zero. And, with the first PMOS transistor P1 being on and the third PMOS transistor P3 being partially on, the output bar OUTB has a voltage of approximately VPHV—1.2 V, logic one.

When writing a one to the memory cell 10, the bit line BL is driven to VDD, and the bit line bar BLB is driven to zero Volts. The sequence of adjusting the voltage levels for each of the three phases is the same as described above. The difference is that the voltages of the bit lines BL, BLB are reversed so that during the second write phase, the gate of the first NMOS transistor N1 receives VDD from BL and is turned on. The gate of the second NMOS transistor N2 receives zero Volts from BLB and is turned off. In addition, during the third write phase, the gate of the first PMOS transistor P1 receives the bit line BL voltage of VDD, which turns the first PMOS transistor P1 off. The gate of the second PMOS transistor P2 receives the bit line bar BLB voltage of zero Volts, which turns the second PMOS transistor P2 on. With the second PMOS transistor P2 being on and the fourth PMOS transistor P4 being partially on, the output OUT has a voltage of approximately VPHV—1.2 V, logic one. And, with the first NMOS transistor N1 being on and the third NMOS transistor N3 being partially on, (along with the fifth NMOS transistor N5 being partially on), the output bar OUTB has a voltage of approximately VSS—zero Volts, logic zero.

The memory cell 10 of various examples of the present disclosure may have one or more of the following advantages. The memory cell 10 may be fabricated using foundry standard thin oxide transistors for faster product time to market. In various examples, fabrication of the memory cell 10 may be done solely using such transistors. The fifth PMOS transistor P5 (which may be called an "equalizer" transistor), whose gate voltage is controlled by the bias signal WLP provided by the second word line, may enable robust cell Write under all process, voltage, and temperature (PVT) conditions and for high memory densities. The bias signal WLN, provided on the first word line, having a tuned voltage level may enable at least 2×-3× reduction in transient current during cell Write procedure. Low power characteristics may allow for further physical distance of memory cell 10 from drivers of bit lines BL, BLB to enhance memory area efficiency. Drivers of bit lines BL, BLB may be biased in the VDD domain for simplest circuit architecture and smallest area. A balanced bit line BL, BLB interface—i.e., the bit line BL being electrically connected to the second NMOS transistor N2 and the bit line bar BLB being electrically connected to the first NMOS transistor N1—may provide for enhanced Read disturb prevention. The cell area of the memory cell 10 may be at least 5%, at least 9%, or at least 12.5% smaller than the cell area of prior art memory cells.

Throughout this specification, references to "one example", "an example", or "examples" mean that the feature or features being referred to are included in at least one example of the technology. Separate references to "one example", "an example", or "examples" in this description do not necessarily refer to the same example and are also not mutually exclusive unless so stated and/or except as will be readily apparent to those skilled in the art from the description. For example, a feature, structure, act, etc. described in one example may also be included in other examples, but is not necessarily included. Thus, the current disclosure can include a variety of combinations and/or integrations of the examples described herein.

Although the present application sets forth a detailed description of numerous different examples, it should be understood that the legal scope of the description is defined by the words of the claims set forth at the end of this patent and equivalents. The detailed description is to be construed as illustrative only and does not describe every possible example since describing every possible example would be impractical. Numerous alternative examples may be implemented, using either current technology or technology developed after the filing date of this patent, which would still fall within the scope of the claims.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus.

The patent claims at the end of this patent application are not intended to be construed under 35 U.S.C. § 112(f) unless traditional means-plus-function language is expressly recited, such as "means for" or "step for" language being explicitly recited in the claim(s).

Although the technology has been described with reference to the examples illustrated in the attached drawing figures, it is noted that equivalents may be employed and substitutions made herein without departing from the scope of the technology as recited in the claims.

Having thus described various examples of the technology, what is claimed as new and desired to be protected by Letters Patent includes the following:

1. A memory cell comprising:

first and second n-type metal oxide semiconductor (NMOS) transistors electrically connected to one another in a cross-coupled configuration;

first and second p-type metal oxide semiconductor (PMOS) transistors electrically connected to one another in a cross-coupled configuration;

third and fourth NMOS transistors, wherein a gate of the third NMOS transistor is electrically connected to a gate of the fourth NMOS transistor, a source of the third NMOS transistor is electrically connected in a cascode configuration to a drain of the first NMOS transistor, and a source of the fourth NMOS transistor is electrically connected in a cascode configuration to a drain of the second NMOS transistor;

third and fourth PMOS transistors, wherein a gate of the third PMOS transistor is electrically connected to a gate of the fourth PMOS transistor, a source of the third PMOS transistor is electrically connected in a cascode configuration to a drain of the first PMOS transistor, and a source of the fourth PMOS transistor is electrically connected in a cascode configuration to a drain of the second PMOS transistor; and a fifth PMOS transistor, a drain of the fifth PMOS transistor electrically connected to a gate of the second PMOS transistor and a drain of the first PMOS transistor, and a source of the fifth PMOS transistor electrically connected to a gate of the first PMOS transistor and a drain of the second PMOS transistor.

2. The memory cell of claim 1, comprising fifth and sixth NMOS transistors, wherein a source of the fifth NMOS transistor is electrically connected to the drain of the first NMOS transistor, to the source of the third NMOS transistor, and to the gate of the second NMOS transistor, a source of the sixth NMOS transistor is electrically connected to the drain of the second NMOS transistor, to the source of the fourth NMOS transistor, and to the gate of the first NMOS transistor, a drain of the fifth NMOS transistor is electrically connected to a bit line bar electronic signal, a drain of the sixth NMOS transistor is electrically connected to a bit line electronic signal, and a gate of the fifth NMOS transistor and a gate of the sixth NMOS transistor respectively are electrically connected to a first word line electronic signal.

3. The memory cell of claim 1, wherein a drain of the third NMOS transistor is electrically connected to a source of the third PMOS transistor, and a drain of the fourth NMOS transistor is electrically connected to a source of the fourth PMOS transistor.

4. The memory cell of claim 1, comprising an output electrically connected to the fourth PMOS transistor and the fourth NMOS transistor.

5. The memory cell of claim 4, wherein the output is capable to have a voltage ranging from approximately zero Volts to approximately a voltage value from a source supplying voltage to the memory cell.

6. The memory cell of claim 1, wherein the gate of the third NMOS transistor and the gate of the fourth NMOS transistor are electrically connected to a first bias electronic signal, the first bias electronic signal having a voltage ranging from approximately zero Volts to approximately 0.7 Volts.

7. The memory cell of claim 1, wherein the gate of the third PMOS transistor and the gate of the fourth PMOS transistor are electrically connected to a second bias electronic signal having a voltage ranging from approximately 0.5 Volts to approximately 0.7 Volts.

8. The memory cell of claim 1, wherein the gate of the fifth PMOS transistor is electrically connected to a second word line bias electronic signal having a voltage ranging from a first voltage that turns the fifth PMOS transistor off to a second voltage that turns the fifth PMOS transistor on.

9. The memory cell of claim 1, wherein applying a voltage to the gate of the fifth PMOS transistor sufficient to turn the fifth PMOS transistor on creates an electrical connection between the gate of the first PMOS transistor, the source of the first PMOS transistor, the gate of the second PMOS transistor, and the source of the second PMOS transistor such that the gate of the first PMOS transistor, the source of the first PMOS transistor, the gate of the second PMOS transistor, and the source of the second PMOS transistor each have approximately the same voltage.

10. The memory cell of claim 1, wherein the first and second NMOS transistors respectively include a source that is electrically connected to an electrical common point.

11. The memory cell of claim 1, wherein the first and second PMOS transistors respectively include a source that is electrically connected to a voltage supply having a voltage ranging from approximately 0.84 Volts to approximately 1.4 Volts.

12. A memory cell comprising:

first and second n-type metal oxide semiconductor (NMOS) transistors electrically connected to one another in a cross-coupled configuration, the first and second NMOS transistors respectively including a source that is electrically connected to an electrical common point;

first and second p-type metal oxide semiconductor (PMOS) transistors electrically connected to one another in a cross-coupled configuration, the first and second PMOS transistors respectively including a drain that is electrically connected to a voltage supply having a voltage ranging from approximately 0.84 Volts to approximately 1.4 Volts;

third and fourth NMOS transistors, wherein a gate of the third NMOS transistor is electrically connected to a gate of the fourth NMOS transistor, a source of the third NMOS transistor is electrically connected in a cascode configuration to a drain of the first NMOS transistor, and a source of the fourth NMOS transistor is electrically connected in a cascode configuration to a drain of the second NMOS transistor;

third and fourth PMOS transistors, wherein a gate of the third PMOS transistor is electrically connected to a gate of the fourth PMOS transistor, a source of the third PMOS transistor is electrically connected in a cascode configuration to a drain of the first PMOS transistor, and a source of the fourth PMOS transistor is electrically connected in a cascode configuration to a drain of the second PMOS transistor;

a fifth PMOS transistor, a drain of the fifth PMOS transistor electrically connected to a gate of the second PMOS transistor and a drain of the first PMOS transistor, and a source of the fifth PMOS transistor electrically connected to a gate of the first PMOS transistor and a drain of the second PMOS transistor; and fifth and sixth NMOS transistors, wherein a source of the fifth NMOS transistor is electrically connected to the drain of the first NMOS transistor, the source of the third NMOS transistor, and the gate of the second NMOS transistor, a source of the sixth NMOS transistor is electrically connected to the drain of the second NMOS transistor, the source of the fourth NMOS transistor, and the gate of the first NMOS transistor, a drain of the fifth NMOS transistor is electrically connected to a bit line bar electronic signal, a drain of the sixth NMOS transistor is electrically connected to a bit line electronic signal, and a gate of the fifth NMOS transistor and a gate of the sixth NMOS transistor respectively are electrically connected to a first word line electronic signal.

13. The memory cell of claim 12, wherein the third NMOS transistor is electrically connected to the third PMOS transistor, and the fourth NMOS transistor is electrically connected to the fourth PMOS transistor.

14. The memory cell of claim 12, comprising an output electrically connected to the fourth PMOS transistor and the fourth NMOS transistor.

15. The memory cell of claim 14, wherein the output is capable to have a voltage ranging from approximately zero Volts to approximately a voltage value from a source supplying voltage to the memory cell.

16. The memory cell of claim 8, wherein binary data is written to the memory cell in three phases such that the second word line bias electronic signal has a voltage of approximately 1.2 Volts during a first phase and a third phase and a voltage of approximately 0.5 Volts during a second phase.

17. The memory cell of claim 8, wherein binary data is read from the memory cell in two phases such that the second word line bias electronic signal has a voltage of approximately 1.2 Volts during each of a first phase and a second phase.

18. The memory cell of claim 12, wherein the gate of the fifth PMOS transistor is electrically connected to a second word line bias electronic signal having a voltage ranging from a first voltage that turns the fifth PMOS transistor off to a second voltage that turns the fifth PMOS transistor on.

19. The memory cell of claim 12, wherein binary data is written to the memory cell in three phases such that the second word line bias electronic signal has a voltage of approximately 1.2 Volts during a first phase and a third phase and a voltage of approximately 0.5 Volts during a second phase.

20. The memory cell of claim 12, wherein binary data is read from the memory cell in two phases such that the second word line bias electronic signal has a voltage of approximately 1.2 Volts during each of a first phase and a second phase.

* * * * *